United States Patent
Fossum et al.

(10) Patent No.: US 10,283,539 B2
(45) Date of Patent: May 7, 2019

(54) GATELESS RESET FOR IMAGE SENSOR PIXELS

(71) Applicant: DARTMOUTH COLLEGE, Hanover, NH (US)

(72) Inventors: Eric R. Fossum, Wolfeboro, NH (US); Jiaju Ma, West Lebanon, NH (US)

(73) Assignee: DARTMOUTH COLLEGE, Hanover, NH (US)

( * ) Notice: Subject to any disclaimer, the term of this patent is extended or adjusted under 35 U.S.C. 154(b) by 0 days.

(21) Appl. No.: 15/555,911

(22) PCT Filed: Mar. 7, 2016

(86) PCT No.: PCT/US2016/021280
§ 371 (c)(1),
(2) Date: Sep. 5, 2017

(87) PCT Pub. No.: WO2016/141388
PCT Pub. Date: Sep. 9, 2016

(65) Prior Publication Data
US 2018/0047769 A1    Feb. 15, 2018

Related U.S. Application Data

(60) Provisional application No. 62/128,983, filed on Mar. 5, 2015.

(51) Int. Cl.
*H01L 27/148* (2006.01)
*H01L 27/146* (2006.01)
(Continued)

(52) U.S. Cl.
CPC .. *H01L 27/14612* (2013.01); *H01L 27/14641* (2013.01); *H01L 27/14643* (2013.01);
(Continued)

(58) Field of Classification Search
CPC ......... H01L 27/14612; H01L 27/14641; H01L 27/14643; H01L 27/14645;
(Continued)

(56) References Cited

U.S. PATENT DOCUMENTS

| 6,275,261 B1 | 8/2001 | Yamazaki |
| 6,992,714 B1 | 1/2006 | Hashimoto et al. |

(Continued)

FOREIGN PATENT DOCUMENTS

WO    WO 2015/006008 A1    1/2015

OTHER PUBLICATIONS

International Search Report and Written Opinion issued (dated May 12, 2016) in corresponding International Application No. PCT/US2016/021280. (9 pages total).

*Primary Examiner* — Niki H Nguyen
(74) *Attorney, Agent, or Firm* — David V. Rossi; Haug Partners LLP

(57) ABSTRACT

Some embodiments of the present disclosure are directed to an image sensor pixel that is configured for gateless reset of a floating diffusion. Some embodiments are directed to an image sensor comprising a plurality of pixels, at least one pixel comprising a floating diffusion formed in a semiconductor substrate; a transfer gate configured to selectively cause transfer of photocharge stored in the pixel to the floating diffusion; and a reset drain formed in the semiconductor substrate and spaced away from the floating diffusion by an intervening semiconductor region having a dopant type opposite to the dopant type of the reset drain and the floating diffusion, wherein the reset drain is configured to selectively reset the electrostatic potential of the floating diffusion in response to a voltage pulse applied to the reset drain.

20 Claims, 10 Drawing Sheets

(51) Int. Cl.
  *H04N 5/374* (2011.01)
  *H04N 5/378* (2011.01)
  *H04N 5/3745* (2011.01)
(52) U.S. Cl.
  CPC .. *H01L 27/14645* (2013.01); *H01L 27/14689* (2013.01); *H04N 5/374* (2013.01); *H04N 5/378* (2013.01); *H04N 5/3745* (2013.01); *H04N 5/37457* (2013.01)
(58) Field of Classification Search
  CPC ......... H01L 27/14689; H01L 27/14621; H01L 27/14627; H01L 27/1464; H01L 27/1463; H01L 2924/00; H01L 27/14609; H01L 27/14607; H01L 27/1461; H01L 27/307; H01L 27/14685; H01L 2924/12043; H01L 2924/1306; H01L 2224/0557; H01L 2224/13025; H01L 27/148; H01L 29/788; H04N 5/374; H04N 5/37457; H04N 5/378; H04N 5/359; H04N 5/341; H04N 5/372

USPC ....... 257/231, 183, 189, 196, 200, 201, 219, 257/225, 239, 240, 241, 246, 257/E27.082–E27.083, E27.15–E27.163, 257/E29.065, E29.227–E29.24, E21.617, 257/291, E21.185, E21.189, 257/E21.456–E21.458; 438/22, 24, 46, 438/47, 979, 60, 75, 144
See application file for complete search history.

(56) References Cited

U.S. PATENT DOCUMENTS 8,084,796 B2 12/2011 Mori et al.
2016/0141316 A1\* 5/2016 Fossum ............... H01L 27/1461
                 257/228

\* cited by examiner

GATELESS RESET FOR IMAGE SENSOR PIXELS

RELATED APPLICATIONS

This application is filed pursuant to 35 U.S.C. § 371 based on International Application No. PCT/US2016/021280, filed Mar. 7, 2016, which claims the benefit of US Provisional Application No. 62/128,983, filed Mar. 5, 2015, which is hereby incorporated herein by reference in its entirety.

BACKGROUND

The Quanta Image Sensor (QIS) has been proposed as a possible next-generation image sensor. In the single-bit QIS, the specialized, sub-diffraction-limit sized binary-output photo-element sensitive to a single photoelectron is called a "jot". Central to single-bit as well as multi-bit QIS implementations is single-electron sensitivity (~0.15 e-r.m.s.) which can be obtained from high, in-pixel conversion gain, e.g., more than 1000 μV/e-. For the high conversion gain needed, the capacitance of the floating diffusion (FD) node needs to be minimized. According to the present inventors' previous QIS work, the capacitance of the FD node has been greatly reduced, but further reductions in FD node capacitance and/or additional or alternative ways to reduce FD node capacitance may still be advantageous and/or desired. By way of example, in some QIS pixel designs the reset gate (RG) overlap capacitance may still contribute about 10% of the total FD capacitance, so further reduction of this RG overlap capacitance may be possible, and may be desired or necessary for some implementations.

SUMMARY OF SOME EMBODIMENTS

Some embodiments of the present disclosure are directed to an image sensor pixel that is configured for gateless reset of a floating diffusion.

Some embodiments are directed to an image sensor comprising a plurality of pixels, at least one pixel comprising a floating diffusion formed in a semiconductor substrate; a transfer gate configured to selectively cause transfer of photocharge stored in the pixel to the floating diffusion; and a reset drain formed in the semiconductor substrate and spaced away from the floating diffusion by an intervening semiconductor region having a dopant type opposite to the dopant type of the reset drain and the floating diffusion, wherein the reset drain is configured to selectively reset the electrostatic potential of the floating diffusion in response to a voltage pulse applied to the reset drain.

The reset drain may be configured to selectively reset the electrostatic potential of the floating diffusion independent of operation of a reset transistor gate. For example, the floating diffusion and the reset drain may not be configured as source and drain regions of a field effect transistor. In accordance with some embodiments, a gate electrode stack is not formed above the intervening semiconductor region between the floating diffusion and the reset gate.

Some embodiments are directed to a method for providing an image sensor comprising a plurality of pixels, the method comprising forming a floating diffusion in a semiconductor substrate; and forming a reset drain in the semiconductor substrate, wherein the reset drain is spaced away from the floating diffusion by an intervening semiconductor region having a dopant type opposite to the dopant type of the reset drain and the floating diffusion, and the reset drain is configured to selectively reset the electrostatic potential of the floating diffusion in response to a voltage pulse applied to the reset drain.

While pixels according to some embodiments of the present invention are well-suited for use in image sensors demanding very high conversion gain (e.g., QIS, qDIS, or other single-bit or multi-bit photoelectron counting sensors), it will be understood in view of the ensuing disclosure that some embodiments of the present invention are also applicable to conventional CMOS image sensors (e.g., present-day, commercially available CMOS image sensors for consumer, manufacturing, and/or scientific applications).

Throughout the description and claims, the following terms take at least the meanings explicitly associated herein, unless the context dictates otherwise. The meanings identified below do not necessarily limit the terms, but merely provide illustrative examples for the terms. The phrase "an embodiment" as used herein does not necessarily refer to the same embodiment, though it may. In addition, the meaning of "a," "an," and "the" include plural references; thus, for example, "an embodiment" is not limited to a single embodiment but refers to one or more embodiments. Similarly, the phrase "one embodiment" does not necessarily refer the same embodiment and is not limited to a single embodiment. As used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise.

Also, as used herein, "n" and "p" designations (e.g., as in "n-type," "p-type," "n-well," etc.) are used in ordinary and customary manner to designate donor and acceptor type impurities that promote electron and hole carriers, respectively, as majority carriers. The term "substrate" is to be understood as a semiconductor-based material such as silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "substrates" in the following description, previous process steps may have been utilized to form regions or junctions in the base semiconductor structure or foundation. In addition, the semiconductor need not be silicon-based, but may be based on, for example, silicon-germanium, germanium, or gallium arsenide.

In addition, as used herein, unless the context clearly dictates otherwise, the term "coupled" refers to directly connected or to indirectly connected through one or more intermediate components and, in some contexts, may also denote or include electrically coupled, such as conductively coupled, capacitively coupled, and/or inductively coupled. Further, "conductively coupled" refers to being coupled via one or more intermediate components that permit energy transfer via conduction current, which is capable of including direct current as well as alternating current, while "capacitively coupled" refers to being electrostatically coupled through one or more dielectric media, and possibly also via one or more intervening conductors (e.g., via a series of capacitive components), that permit energy transfer via displacement current and not via direct current. Those skilled in the art will further understand that elements may be capacitively coupled intentionally or unintentionally (e.g., parasitically) and that in some contexts, elements said to be capacitively coupled may refer to intentional capacitive coupling. In addition, those skilled in the art will also understand that in some contexts the term "coupled" may refer to operative coupling, through direct and/or indirect connection. For instance, a conductor (e.g., control line) said to be coupled to the gate of a transistor may refer to the conductor being operable to control the gate potential so as to control the operation of the transistor (e.g., switching the transistor between "on" and "off" states), regardless of whether the conductor is connected to the gate indirectly (e.g., via another transistor, etc.) and/or directly.

It will be appreciated by those skilled in the art that the foregoing brief description and the following description with respect to the drawings are illustrative and explanatory of some embodiments of the present invention, and are neither representative nor inclusive of all subject matter and embodiments within the scope of the present invention, nor intended to be restrictive or characterizing of the present invention or limiting of the advantages which can be achieved by embodiments of the present invention, nor intended to require that the present invention necessarily provide one or more of the advantages described herein with respect to some embodiments. Thus, the accompanying drawings, referred to herein and constituting a part hereof, illustrate some embodiments of the invention, and, together with the detailed description, serve to explain principles of some embodiments of the invention.

BRIEF DESCRIPTION OF THE DRAWINGS

Aspects, features, and advantages of some embodiments of the invention, both as to structure and operation, will be understood and will become more readily apparent in view of the following description of non-limiting and non-exclusive embodiments in conjunction with the accompanying drawings, in which like reference numerals designate the same or similar parts throughout the various figures, and wherein.

DETAILED DESCRIPTION OF SOME EMBODIMENTS

Illustrative embodiments of a gateless reset method and device are disclosed. Such embodiments are well suited, for example, for reducing the FD capacitance by eliminating and/or reducing the RG overlap capacitance (e.g., compared to a pixel/jot that includes a reset transistor having a RD and a selectively pulsed RG overlapping the FD).

Additionally or alternatively, gateless reset according to some embodiments of the present disclosure allows for shrinking the pixel (e.g., jot) size by reducing the number of gates, and/or allows for simplifying the pixel (e.g., jot) fabrication masks layout by eliminating a bus, e.g., effectively reassigning the reset bus conventionally used for RGs to the reset drains (RD). As those skilled in the art will understand in view of the present disclosure, gateless reset embodiments according to the present disclosure are particularly well-suited for implementing a QIS (e.g., a single bit or multi-bit QIS having, for example, a full well capacity (FWC) of $2^n-1$ photocarriers, where n is an integer typically not greater than 6 or 7) as well as other jot-based image sensors. Some gateless reset embodiments of the present disclosure are expected to reduce the FD capacitance by about 10% to 20%, thus significantly increasing (e.g., by about 11% to 25%) the in-pixel (e.g., in-jot) conversion gain compared to gated reset implementations.

Figure 1:
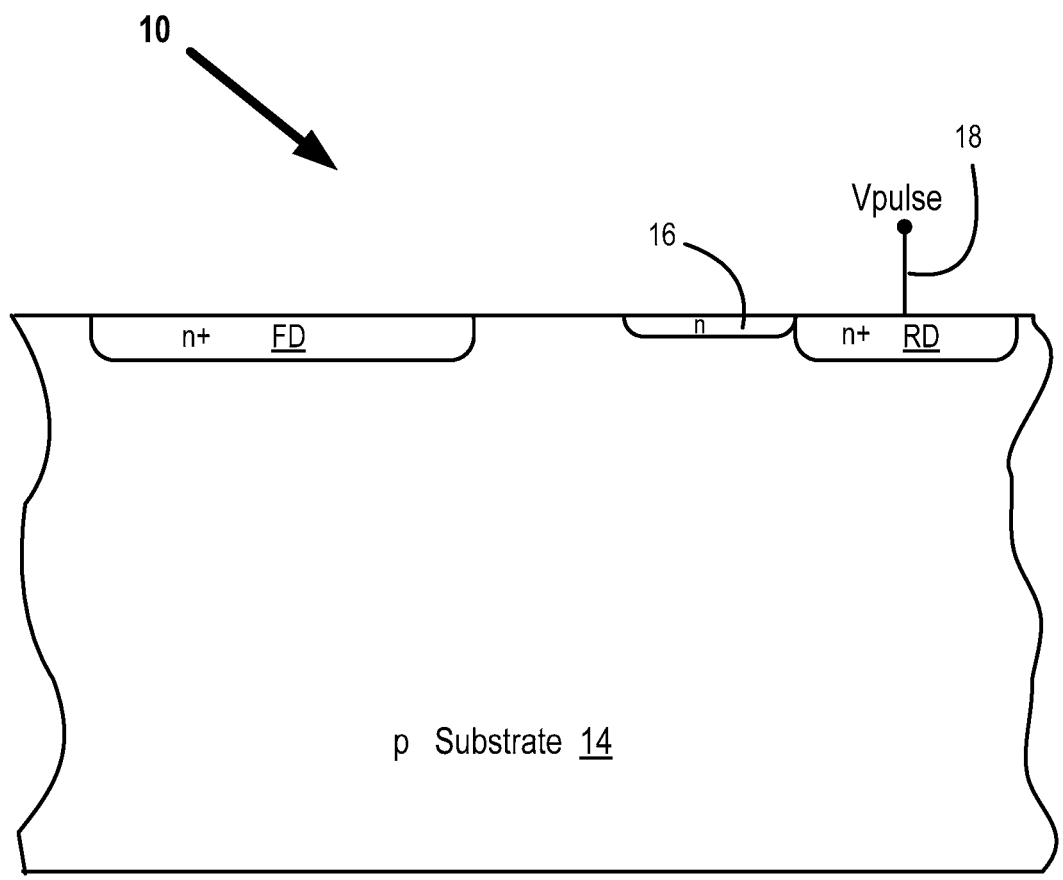
FIG. 1 schematically depicts an illustrative cross-sectional view of a portion of a pixel of an image sensor, in accordance with some embodiments of the present disclosure.

A cross-sectional doping schematic of an illustrative embodiment of gateless reset of a floating diffusion (FD) by a reset drain (RD) is depicted in FIG. 1. As embodiments of the present disclosure are not limited to a particular pixel configuration, for clarity FIG. 1 focuses on the FD and RD portion 10 of a pixel (e.g., jot) and does not show other pixel features, such as a photodiode, a transfer gate, and a source-follower transistor. More specifically, FIG. 1 schematically depicts an illustrative embodiment in which floating diffusion (FD) and reset drain (RD; which may also be referred to as a reset diffusion (RD), in accordance with some embodiments) are formed as heavily-doped n-type dopant regions (e.g., n+) in a p-type substrate 14. In this illustrative embodiment, as shown, RD also includes a less heavily doped (e.g., compared to the n+doping) n-type region 16 disposed laterally in the direction of the FD. As will be understood by those skilled in the art, the illustrative gateless reset embodiment shown in FIG. 1 does not include a reset transistor gate formed between the FD and RD regions (e.g., as shown, there is no gate electrode stack disposed on the surface above and between the FD and the RD. In operation, the FD potential is reset by selectively applying a voltage pulse $V_{pulse}$ to the RD via a conductive line 18 (e.g., interconnect metallization) to control charge transfer from the FD region to the RD region, without employing a transistor-gate-controlled conductive channel (e.g., comprising inversion layer charge) between the FD and RD.

Figure 2:
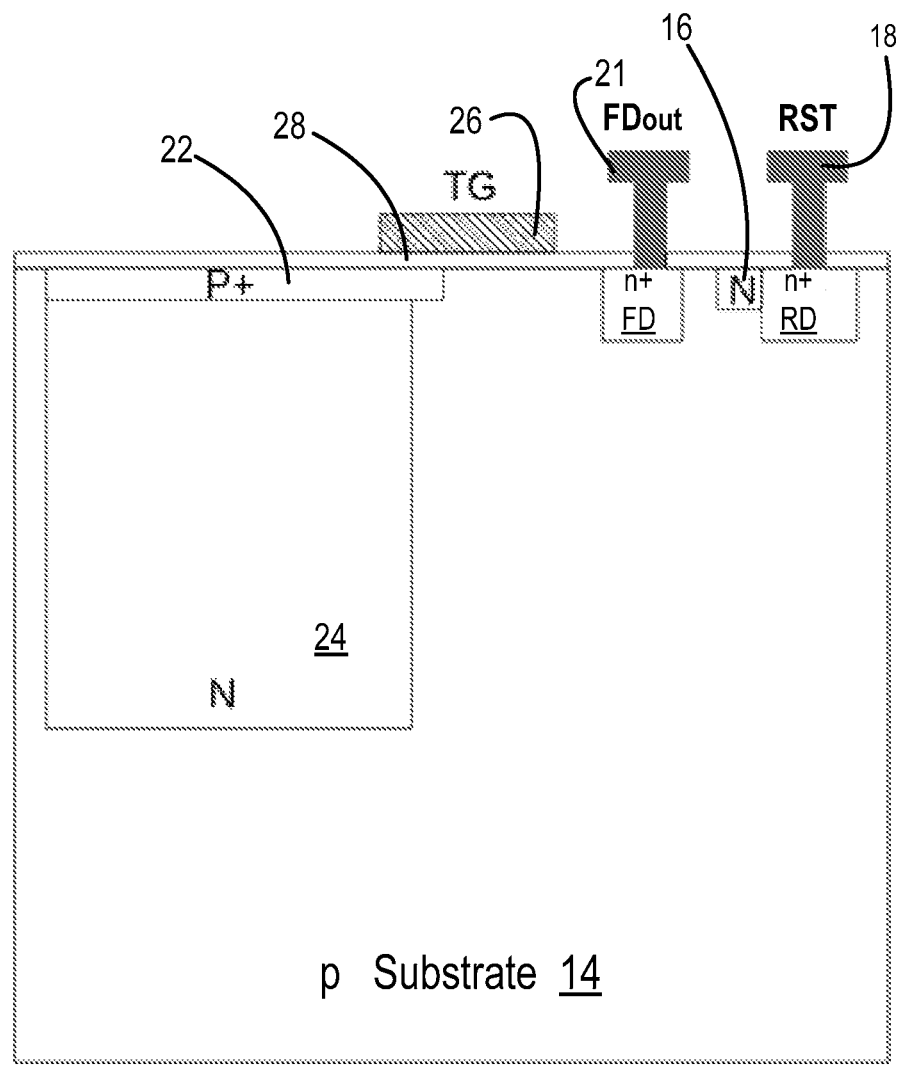
FIG. 2 schematically depicts a cross-sectional view of an illustrative pixel that incorporates gateless reset according to some embodiments of the present disclosure.
Figure 3:
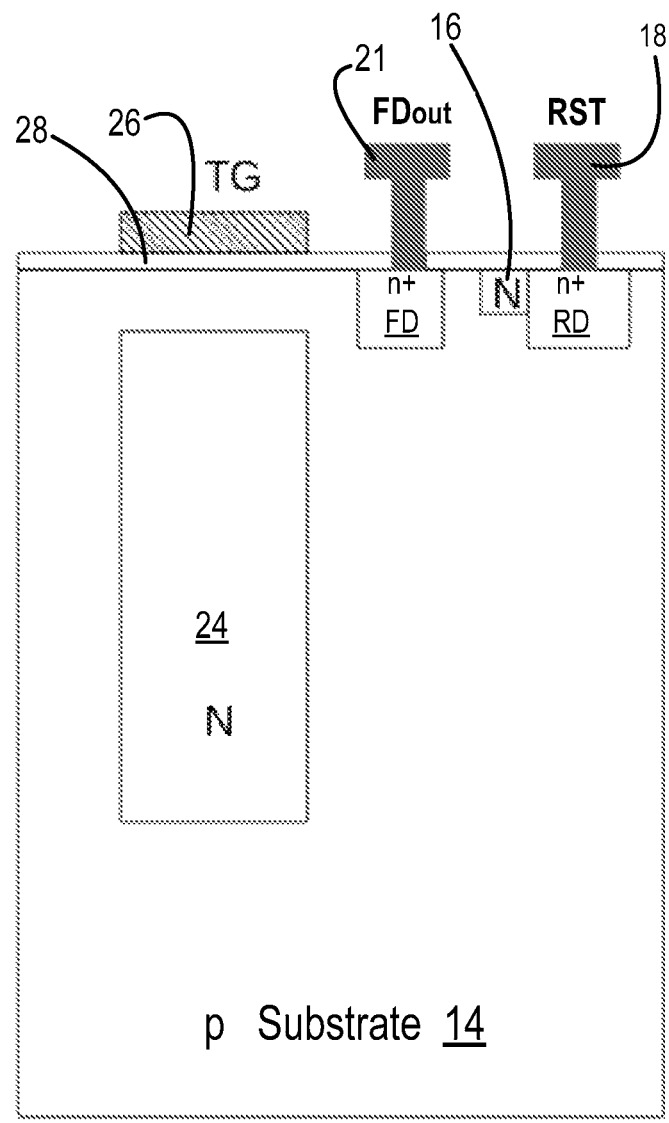
FIG. 3 schematically depicts a cross-sectional view of an illustrative pixel that incorporates gateless reset according to some embodiments of the present disclosure.

By way of example, FIGS. 2 and 3 depict cross-sectional views of two different types of illustrative pixels that each incorporates gateless reset according to some embodiments of the present disclosure. More specifically, FIG. 2 schematically depicts a portion of a pixel having a pinned photodiode (PPD) formed laterally adjacent to a transfer gate (TG), with the n+ FD spaced away (distal) from a transfer gate (TG) so as to reduce and/or eliminate TG-FD overlap capacitance. As understood by those skilled in the art, PPD comprises p+ pinning layer 22 and n-type charge storage/accumulation region 24, the transfer gate (TG) stack comprises a TG electrode/conductor 26 and a gate dielectric 28, and the TG is selectively controlled to cause charge transfer of photo-generated charge (electrons according to this embodiment) accumulated in storage/accumulation region 24 to the FD region. Also schematically depicted is conductor 21 (e.g., metallization/interconnect) ohmically/conductively coupled to FD to provide the floating diffusion potential ($FD_{out}$) for readout (e.g., provided to an in-pixel source-follower amplifier). As in the illustrative embodiment of FIG. 1, the RD comprises an n+ region as well as a more lightly doped n-type region 16, with the n+ region ohmically coupled to a conductive line 18 to which a reset voltage pulse (RST; corresponding to $V_{pulse}$ in FIG. 1) is selectively applied for selectively resetting the FD potential, without employing a transistor-gate-controlled conductive channel (e.g., comprising inversion layer charge) between the FD and RD.

FIG. 3 schematically depicts a portion of a pixel having a pinned photodiode formed beneath a transfer gate (TG) and configured as a vertical pump-gate with the FD spaced away (distal) from the transfer gate (TG) so as to reduce and/or eliminate TG-FD overlap capacitance. Except for including a gateless reset in accordance with the present disclosure, such a vertical pump-gate pixel (e.g., jot) may be configured in accordance with low-full-well-capacity vertical pump-gate pixels as disclosed in (i) U.S. Provisional Application No. 61/973,825, filed Apr. 1, 2014, entitled CMOS Image Sensor with Pump Gate and Extremely High Conversion Gain, and (ii) "A Pump-gate Jot Device with High Conversion Gain for a Quanta Image Sensor," IEEE Journal of the Electron Devices Society, 3(2), February 2015, each of which is hereby incorporated by reference herein in its entirety. For example, although not explicitly shown in FIG. 3, such a vertical pump-gate pixel may include a p+ doped pinning region laterally bounding the buried n-type charge storage region.

Gateless reset according to some embodiments relies on the fringing field effect of the RD on the FD. More specifically, by way of non-limiting example, when the reset operation is not activated, the RD node is held at a voltage Vrd (e.g., 2.5V) such that the FD and RD are essentially conductively and electrostatically isolated from each other (e.g., there is no charge transfer therebetween; and there is negligible and/or essentially no capacitive coupling therebetween). During the reset, the RD is biased to a higher voltage Vrst (e.g., 5V) such that the potential difference between the RD and FD provides for a fringing field that lowers the potential barrier to charge transport (e.g., injection) from the (e.g., n+) FD to the intervening oppositely-doped (e.g., p-type) gap region and assists charge transfer from the FD to the RD. Concomitantly, the potential difference during reset is sufficient to cause depletion of a continuous portion of the (e.g., p-type) gap region between the (e.g., n/n+ type) FD and RD. In some embodiments, the gateless reset device is designed such that continuous depletion of this gap region also exists when the reset operation is not activated (i.e., when Vrd is applied to the RD),and where the application of Vrst modulates the potential barrier between FD and RD, which may allow for reducing the reset voltage Vrst required for charge transfer, as well as reducing pixel size, compared to designs wherein the gap includes neutral region when the reset operation is not activated. Such a device does not require punchthrough to occur in order to permit the reset operation.

Gateless resetting according to some embodiments of the present disclosure may be further understood in view of the below-described FIGS. 4 through 9, which include graphical depictions of various potential profiles for non-limiting illustrative examples of simulations that were conducted for gateless reset device structures such as depicted in FIG. 1, and which do not require punchthrough to enable operation.

Figure 4:
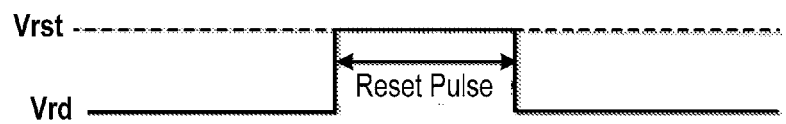
FIG. 4 shows a timing diagram of a reset drain pulse that was applied during simulations of illustrative embodiments.

More specifically, FIG. 4 shows a timing diagram of the RD pulse that was applied during the simulations. A 100 ns RD pulse duration was used in the examples illustrated herein.

Figure 5:
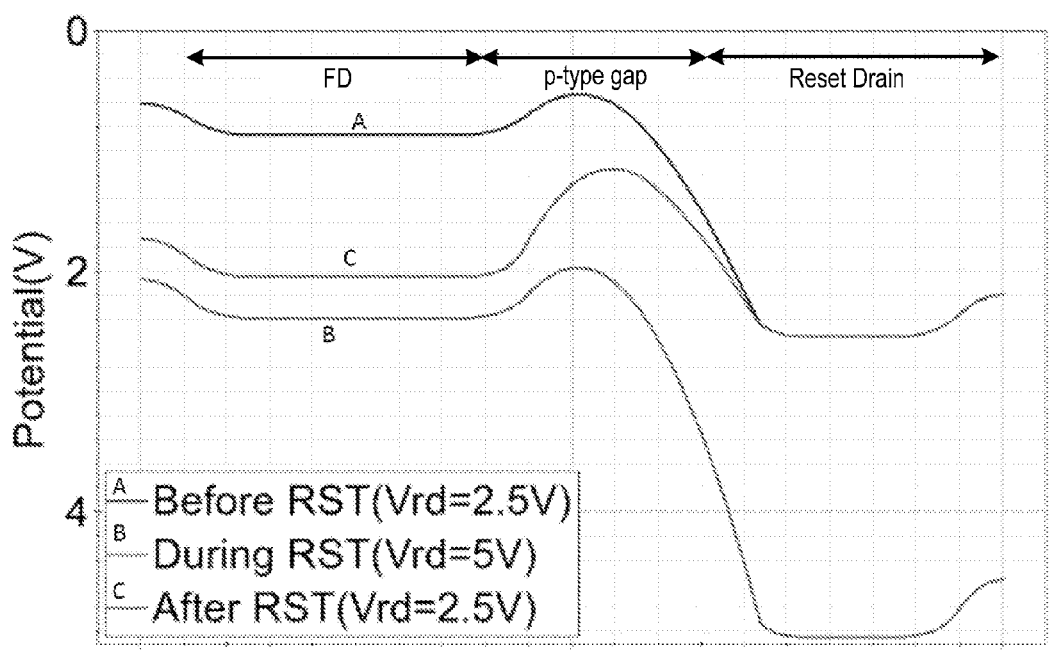
FIGS. 5 through 9 show electrostatic potential profiles for simulations of gateless reset device structures in accordance with illustrative embodiments according to the present disclosure.

FIG. 5 shows the potential profiles before, during, and after reset, as obtained through simulation of a non-limiting example in which the p-type gap region between the FD and RD was 0.2 µm, and Vrd and Vrst were 2.5 V and 5.0 V, respectively. (It will be understood that, e.g., different (such as lower) voltages appropriate to a particular technology node are also possible; device dimensions, doping profiles, etc., may also be varied.)

As depicted in FIG. 5, the p-type region between FD and RD forms a potential barrier, and when Vrst is applied to RD, the height of the potential barrier will be reduced because of the fringing effect. Charge in the FD will be transferred to RD, and as the charge transfers, the FD potential increases until it reaches the peak of the potential barrier. (In fact, discharge of FD continues due to emission over the potential barrier and continues logarithmically in time). When the reset operation stops and the bias voltage on the RD node returns to Vrd, the p-type region will again form a higher potential barrier between FD and RD, preventing charge transfer between the two nodes. In some respects, this gateless reset may be considered as essentially a "virtual gate reset" device.

Because there is a potential barrier between FD and RD during the reset, compared to using a conventional reset transistor, the reset voltage change of FD will be reduced. But taking advantage of the small full-well-capacity (FWC) needed by a QIS pixel (e.g., jot), a high voltage swing in FD is not necessary for QIS. The reset voltage of FD should be higher than the source follower threshold voltage, and a voltage swing of, e.g., about 0.1V or less (e.g., about 0.5V) will be typically sufficient for QIS implementations (e.g., jot array implementations).

In accordance with some embodiments, the FD and RD node n-type doping wells are separated by a channel-stop p-type doping well. The gap between the two n+ implant masks needs to be wide enough to ensure a potential barrier between the FD and RD nodes, and in practice, for some implementations, the minimum width of such a gap may be limited by fabrication process requirements. As noted, in the example corresponding to FIG. 5, the gap between two n+ implant masks is 0.2 µm. The doping concentration in the p-type gap needs to be high enough to form a high potential barrier. In the example of FIG. 5, the p-type region has a doping concentration of $1 \times 10^{16}/cm^3$, and the n+ wells have a doping concentration of $2 \times 10^{20}/cm^3$. As shown in FIGS. 1-3, an n-type buried channel well (e.g., formed adjacent to the RD n+ well) can be used to adjust the width of the p-type gap between the two nodes, but it is not a must. In the example corresponding to FIG. 5, the n-type buried channel has a doping concentration of $1 \times 10^{17}/cm^3$.

As will be understood by those skilled in the art, the width and the doping of the p-type gap together determine the height of the potential barrier. As demonstrated by the simulations, during the reset, the bias voltage of the RD node, Vrst, determined the potential barrier height and the reset voltage of the FD node.

Figure 6:
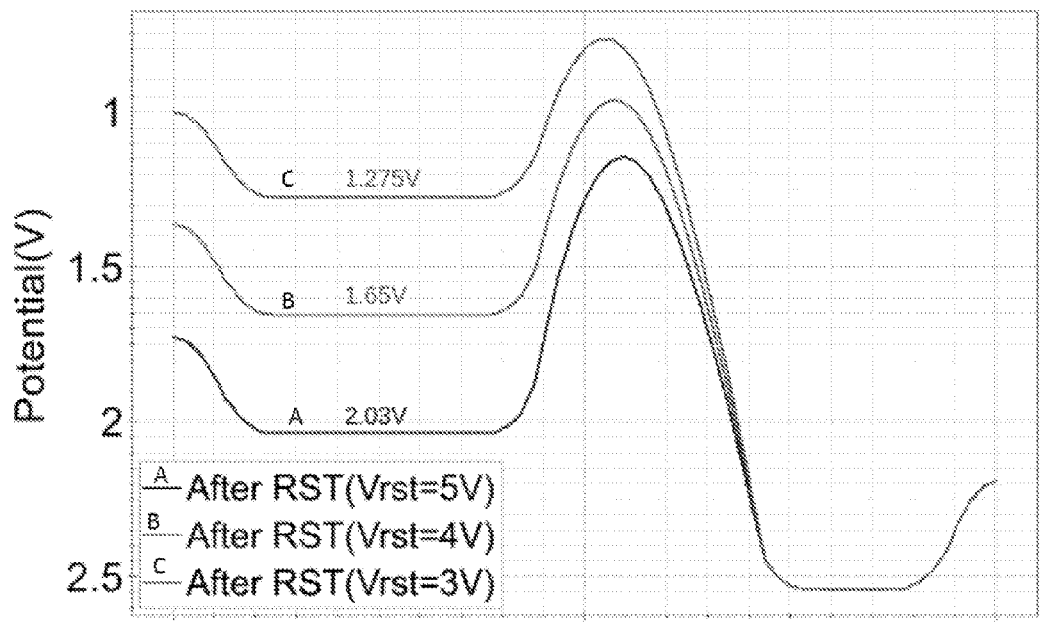

In the simulations, as depicted in FIG. 6, the reset voltage of the FD, Vfd, shows a linear relationship with Vrst (Vrd was 2.5V for each Vrst). Particularly, in FIG. 6, the numerical values of the FD reset voltage (Vfd) following application of respective 3 V, 4 V, and 5 V reset voltage pulses are noted on the respective potential curves (i.e., 1.275 V, 1.65 V, and 2.03 V, respectively). A proper Vrst needed to be adjusted according to the FWC and the source follower operating condition.

Figure 7:
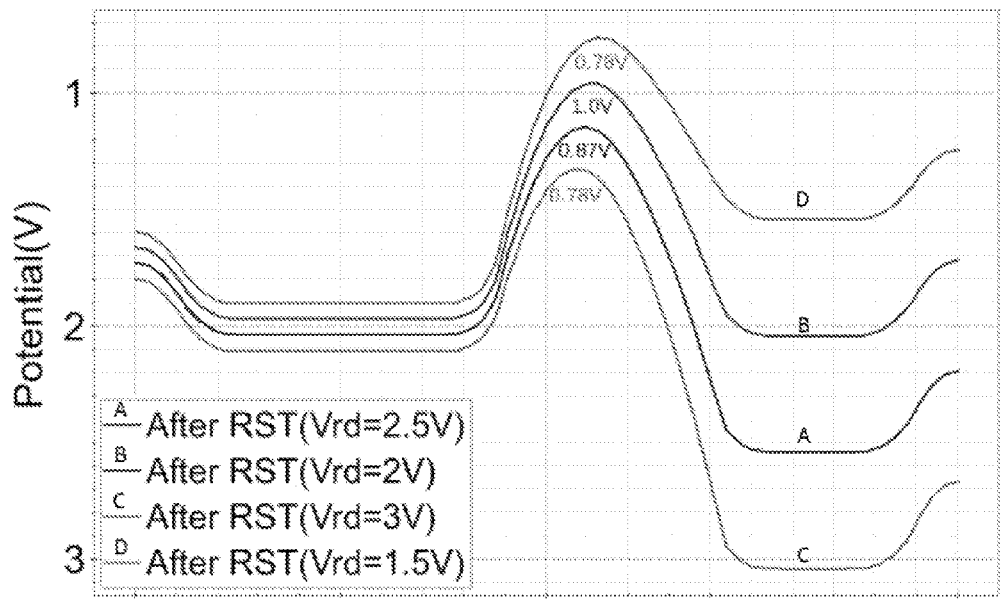

After the reset, especially during the readout of the FD node, it is desired to maintain a sufficiently high potential barrier between the FD and the RD. As demonstrated by the simulations, such as shown in FIG. 7, the height of the potential barrier can be adjusted by the RD bias voltage Vrd.

To realize a high potential barrier, Vrd should be close to the reset voltage of the FD. In this example, when Vrst is 5V, the FD will be reset to about 2V, and the simulation shows that when Vrd is 2V (i.e., about equal to the FD reset voltage Vfd), the potential barrier is the highest, about 1V, which is enough for a QIS operation. For clarity, note that in the simulation results shown in FIG. 7, when Vrd is 1.5V, the barrier from FD-to-RD is about 1.15V, but the barrier from RD-to-FD is about 0.78V; hence, for Vrd=1.5V, the (minimum) potential barrier between FD and RD is 0.78V, which is less than the 1.0V (minimum) potential barrier between FD and RD for Vrd equal to 2V. (Also for clarity of exposition, it is noted that the potential barrier height values (i.e., 0.78 V, 1.0 V, 0.87 V, and 0.78 V) are noted adjacent to the respective potential curves corresponding to respective Vrd values (i.e., 1.5 V, 2.0 V, 2.5 V, and 3.0 V).)

Figure 8:
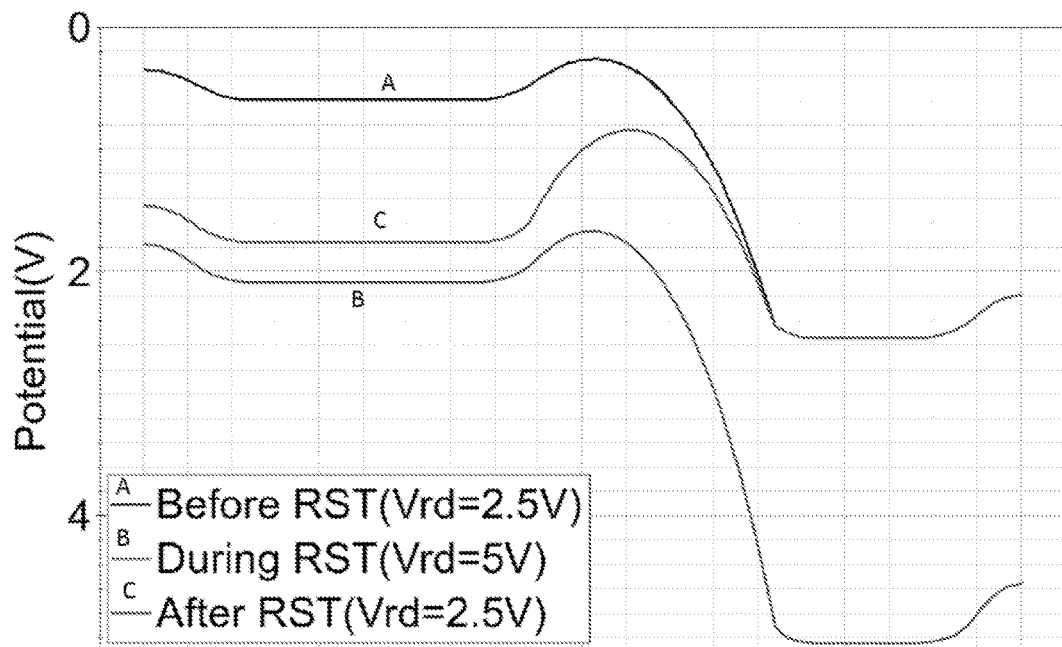
Figure 9:
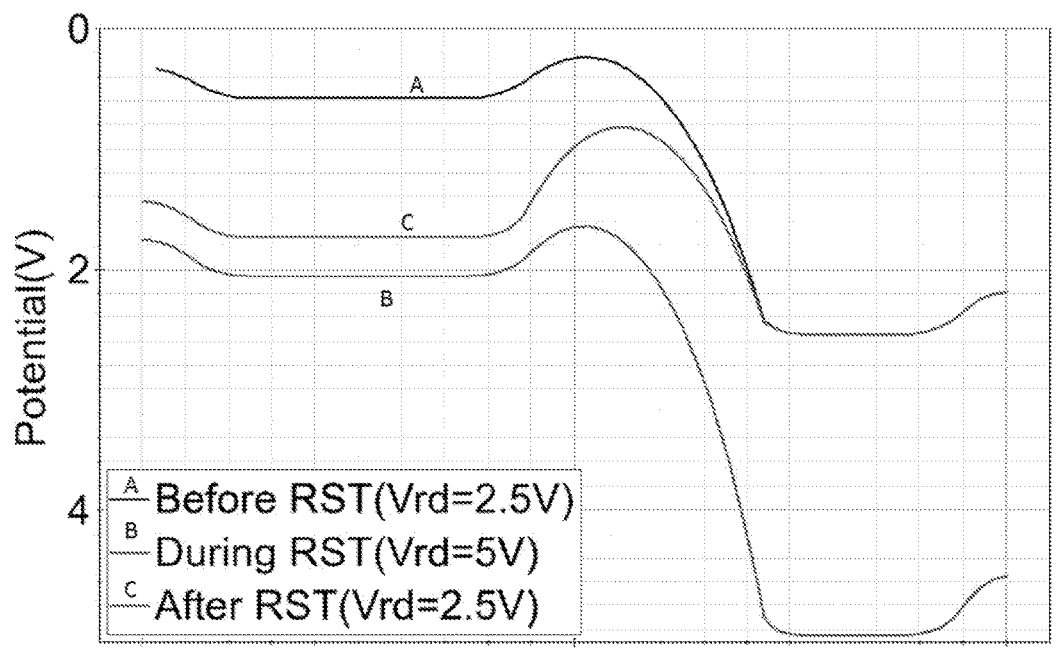

Additional simulations were also performed for varying gap widths. For example, FIGS. 8 and 9 show the potential profiles before, during, and after reset, as obtained through simulation of device structures similar to that used for FIG. 5, but with p-type gap region widths between the FD and RD of 0.3 µm and 0.4 µm, respectively. These simulations show the dependence of the reset level Vfd on the gap width (the same doping level was used).

As indicated above, FIGS. 1-3 show cross-sectional views of only a portion of the pixel circuitry of an image sensor. For additional clarity, FIGS. 10, 11, and 12 each show, by way of example, further illustrative embodiments of a portion of a pixel having a pinned photodiode (PPD) formed laterally adjacent to a transfer gate (TG) (similar to the pixel shown in FIG. 2, but with the transfer gate (TG) stack overlapping the FD), while also showing the FD coupled to the gate of an in-pixel source-follower transistor. More specifically, FIGS. 10 and 11 show that the source-follower transistor may be implemented as an n-channel and p-channel junction field effect transistor (JFET) Jsf, respectively, whereas FIG. 12 shows that the source-follower transistor may be implemented as a metal oxide semiconductor field effect transistor (MOSFET) Msf As shown, the drain regions of Msf in FIG. 12 and n-channel JFET Jsf of FIG. 10 are coupled to bias potential $V_{DD}$.

In various JFET implementations according to some embodiments of the present disclosure, the FD may be configured to act as the gate of a JFET. For example, in some embodiments according to FIG. 11, the n-type FD may act as the p-channel JFET's gate, providing charge modulation of the p-channel. Alternatively, in some embodiments according to FIG. 11, the FD may not act as the gate of the JFET, but instead be connected to the JFET gate. It will be understood that in the illustrative embodiment of FIG. 10, the FD is connected to the JFET, and would not be configured to instead act as the JFET gate, as the FD doping type is opposite to that of the JFET gate doping (and of the same type as the JFET channel).

Figure 10:
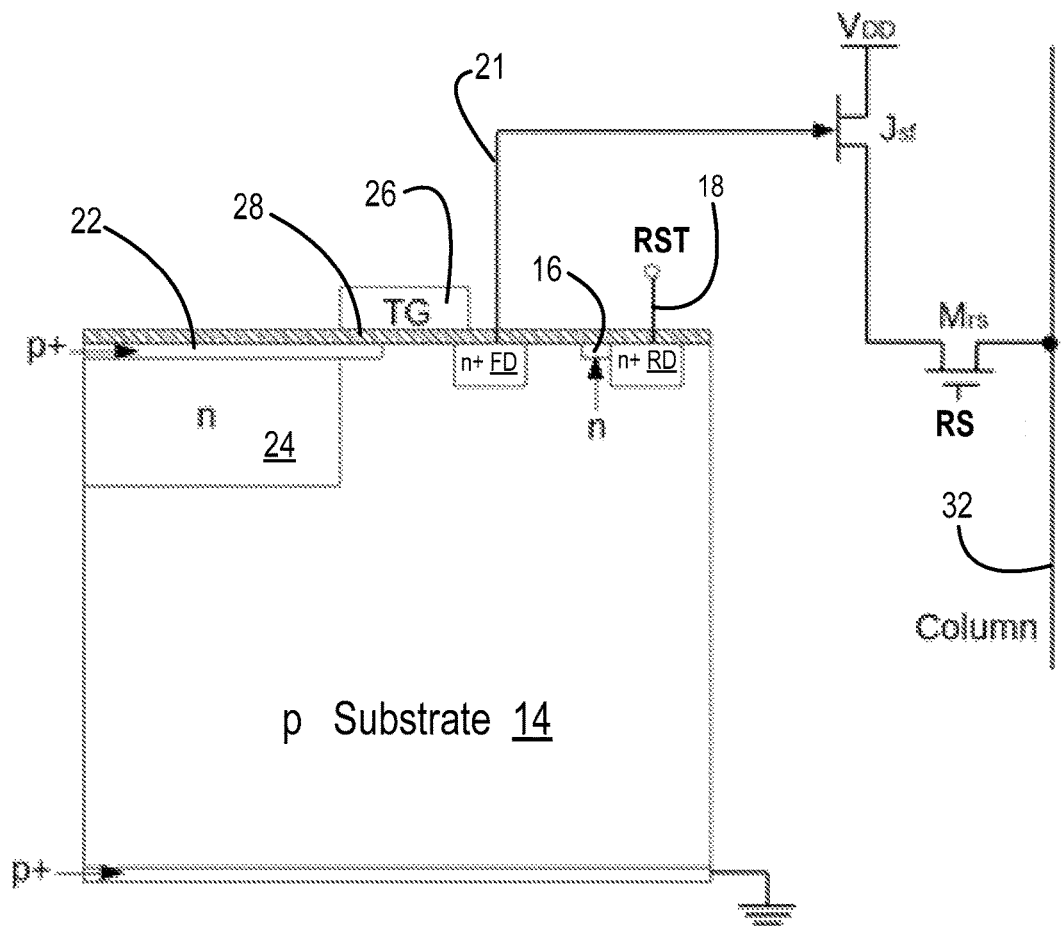
FIGS. 10, 11, and 12 each show respective illustrative embodiments of a portion of a pixel configured for gateless reset in accordance with some embodiments.
Figure 11:
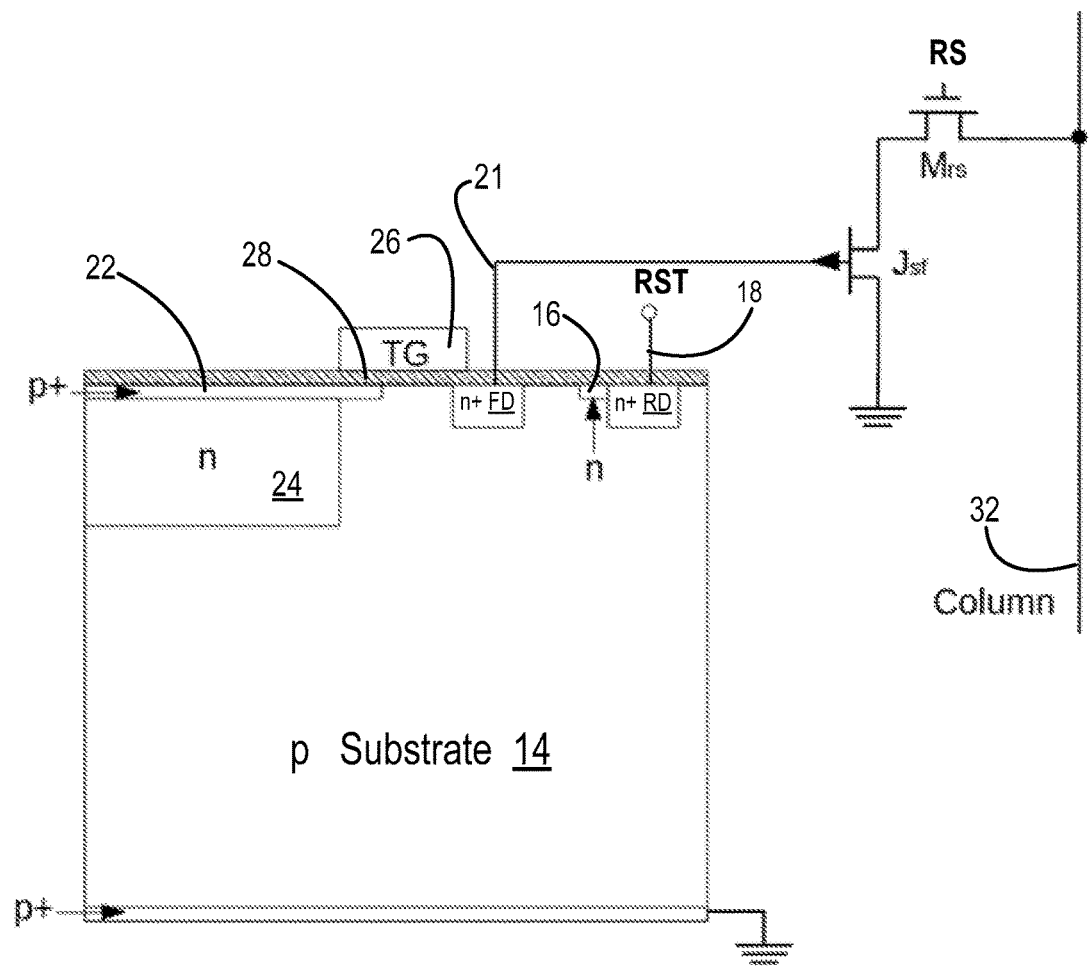
Figure 12:
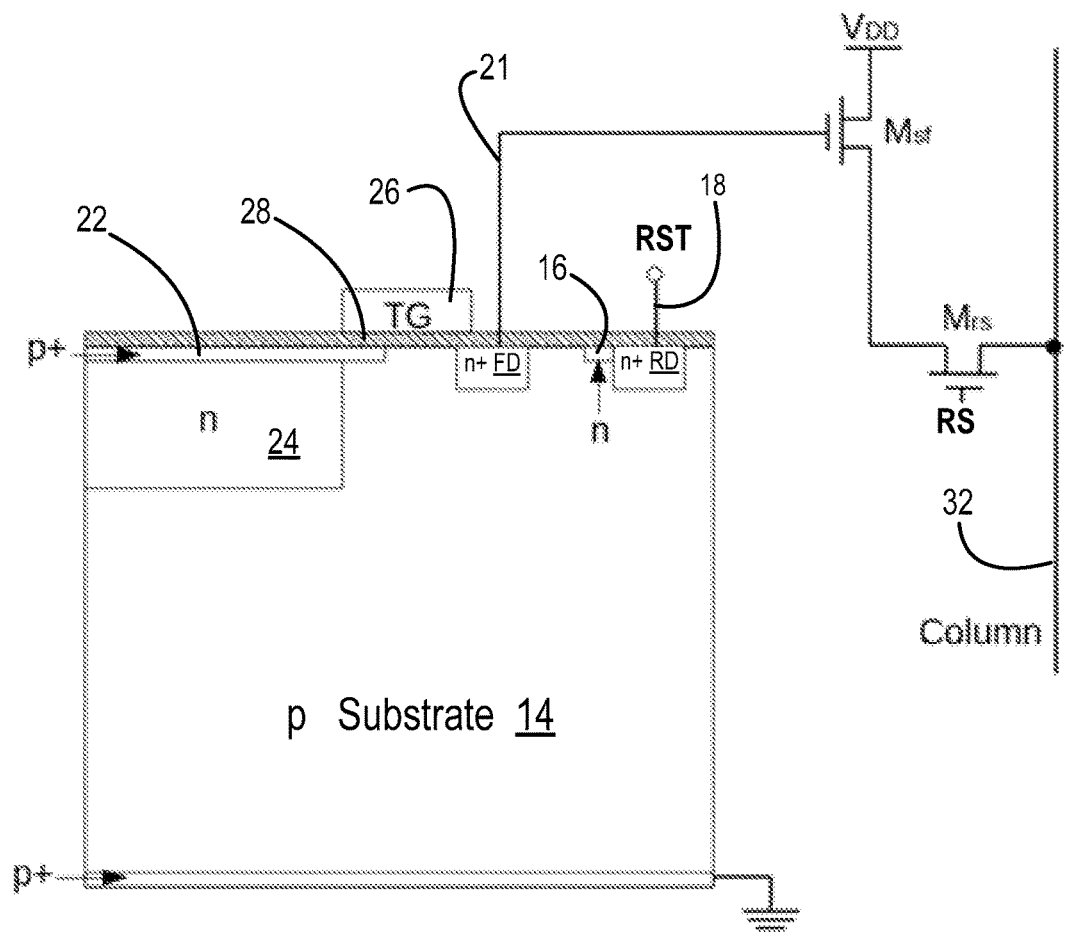

FIGS. 10-12 each also shows that the pixel may also include an in-pixel readout (e.g., row-select) transistor Mrs that, in response to a readout signal RS, selectively couples the source-follower output to a column bus 32 that is coupled to an off-pixel-array load.

Figure 13:
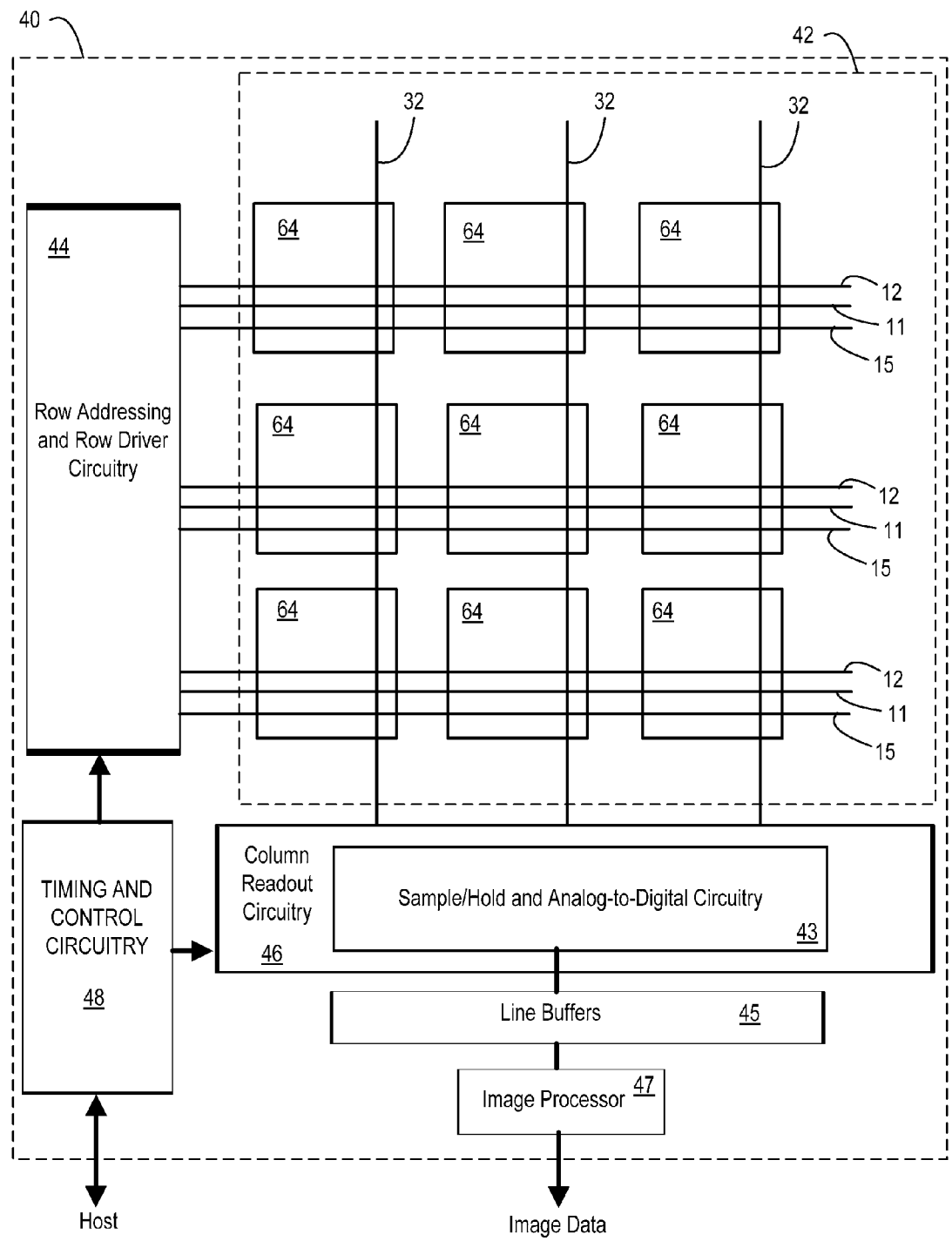
FIG. 13 depicts a block diagram of an illustrative image sensor architecture that may be used to implement embodiments in accordance with the present disclosure, in accordance with some embodiments.

FIG. 13 depicts a block diagram of an illustrative CMOS image sensor 40 architecture that may be used to implement embodiments in accordance with the present disclosure, such as embodiments comprising pixels that employ gateless resetting of the FD in accordance with those described hereinabove in connection with FIGS. 1-3 and 10-12. As well known, pixel array 42 typically includes a large number of pixels arranged in an M×N array; however, CMOS image sensor 40 is shown as including a simplified pixel array 42 comprising a three by three array of pixels 64, which, for ease of discussion, is a pixel circuit in accordance with any of the embodiments of FIGS. 2, 3, and 10-12, but may be any of a variety of pixel circuit types that are configured to implement gateless resetting in accordance with the present disclosure. And, for example, in some embodiments, the pixels may be shared pixels (e.g., sharing a FD and RD and possibly additional readout circuitry) and may further be configured for in-pixel binning.

Row Addressing and Row Driver Circuitry 44 generates transfer gate (TG) control signals on lines 11, row select (RS) signals on lines 15, and reset drain (RD) control signals (e.g., RST) on lines 12. Column Readout Circuitry 46 includes analog-to-digital circuitry 43 for sampling and digitizing output values readout from the pixel array 42. Particularly, circuitry 43 may be implemented to comprise a plurality of A/D converters configured to implement column-parallel readout. In some embodiments, the circuitry 43 may be configured such that the readout circuitry associated with each column bus 32 may have a respective analog-to-digital converter (ADC), though in some embodiments pairs of columns may share an ADC.

Timing and control circuitry 48 controls both the row addressing and row driver circuitry 44 and the column readout circuitry 43. For instance, timing and control circuitry controls the row addressing and row driver circuitry 44 for selecting the appropriate row for readout, and may, for example, provide timing control signals in accordance with rolling shutter readout or global shutter readout. As indicated in FIG. 13, timing and control circuitry 48 may also communicably interface with a host (e.g., a processor associated with a system comprising the image sensor), which may, for example, in some implementations, specify various control information.

As schematically depicted, signals on column buses 32 are sampled and digitized by circuitry 43, and the digitized pixel values provided by the ADCs may be provided to line buffers 45, which may be used to temporarily store digital signals from circuitry 43 for use by image processor 47. In general, any number of line buffers 45 may be included and, for example, each line buffer may be capable of storing digital signals representative of the charge signals that may be read from each pixel in a given row of pixels in the pixel array 42. Image processor 47 may be used to process the digital signals held in line buffers 36 to produce output image data that may be provided to a device external to the image sensor 40.

As may be appreciated, there are many possible alternative implementations of an image sensor architecture that may embody high conversion gain buried-well vertically-pinned pixels in accordance with some embodiments of the present disclosure. By way of example, it will be understood that circuitry 46 may be divided into two portions provided at the top and bottom of the pixels array.

It will be understood in view of the foregoing that some embodiments of the disclosed pixel are well-suited for shared pixels, namely, in shared pixel architectures that share at least the floating diffusion and the reset drain/diffusion (e.g., and which, for example, may also share the source-follower, etc.). (As known to those skilled in the art, such shared architectures may be used for in-pixel charge-domain binning.) By way of example, in some embodiments a four-way shared pixel structure/unit can be used (e.g., possibly comprising 7 transistors per shared pixel unit), which will further shrink the size of each pixel (e.g., each jot of a QIS). And in some such shared-pixel embodiments, the four jots sharing a common FD can be covered by a single color filter and micro lens, which will mitigate the effects of cross-talk between jots. Further, in some such embodiments, each shared-pixel unit comprising four jots (e.g., and having a single color filter and microlens) can be isolated by a single Deep Trench Isolation (DTI) around the set of four jots. That is, four jots sharing a FD are not isolated from each other by DTI, but rather are collectively isolated by DTI from other shared pixel units (i.e., other units of four jots sharing an FD).

Such DTI will further reduce cross talk between shared pixel units associated with respective color filters. It will be understood that other configurations of shared pixel units (e.g., different numbers of jots sharing a common FD) may be implemented accordingly.

In addition, it will be understood that gateless resetting of the FD in an image sensor pixel in accordance with various embodiments of the present invention may be implemented in backside illuminated (BSI) or frontside illuminated image sensors. In other words, embodiments of the present disclosure are not limited exclusively to only one of backside and frontside illuminated image sensors.

The present invention has been illustrated and described with respect to some specific illustrative embodiments thereof, which embodiments are merely illustrative of some of the principles of some embodiments of the invention and are not intended to be exclusive or otherwise limiting embodiments. Accordingly, although the above description of illustrative embodiments of the present invention, as well as various illustrative modifications and features thereof, provides many specificities, these enabling details should not be construed as limiting the scope of the invention, and it will be readily understood by those persons skilled in the art that the present invention is susceptible to many modifications, adaptations, variations, omissions, additions, and equivalent implementations without departing from this scope and without diminishing its attendant advantages. For instance, except to the extent necessary or inherent in the processes themselves, no particular order to steps or stages of methods or processes described in this disclosure, including the figures, is implied. In many cases the order of process steps may be varied, and various illustrative steps may be combined, altered, or omitted, without changing the purpose, effect or import of the methods described. Similarly, the structure and/or function of a component may be combined into a single component or divided among two or more components. It is further noted that the terms and expressions have been used as terms of description and not terms of limitation. There is no intention to use the terms or expressions to exclude any equivalents of features shown and described or portions thereof. Additionally, the present invention may be practiced without necessarily providing one or more of the advantages described herein or otherwise understood in view of the disclosure and/or that may be realized in some embodiments thereof. It is therefore intended that the present invention is not limited to the disclosed embodiments but should be defined in accordance with claims that are based on the present disclosure, as such claims may be presented herein and/or in any patent applications claiming priority to, based on, and/or corresponding to the present disclosure.

What is claimed is:

1. An image sensor comprising a plurality of pixels, at least one pixel comprising:

a floating diffusion formed in a semiconductor substrate;

a transfer gate configured to selectively cause transfer of photocharge stored in the pixel to the floating diffusion; and a reset drain formed in the semiconductor substrate and spaced away from the floating diffusion by an intervening semiconductor region having a dopant type opposite to the dopant type of the reset drain and the floating diffusion, wherein the reset drain and the intervening semiconductor region are configured such that the floating diffusion is selectively reset to an electrostatic potential, and an electrostatic potential barrier between the floating diffusion and the reset drain is selectively set, in response to a voltage pulse selectively applied to the reset drain.

2. The image sensor according to claim 1, wherein the electrostatic potential of the floating diffusion is reset, and the electrostatic potential barrier between the floating diffusion and the reset drain is set, independent of operation of a reset transistor gate.

3. The image sensor according to claim 1, wherein the floating diffusion and the reset drain are not configured as source and drain regions of a given field effect transistor.

4. The image sensor according to claim 1, wherein a gate electrode stack is not formed above the intervening semiconductor region between the floating diffusion and the reset drain.

5. The image sensor according to claim 1, wherein (i) when a first voltage is applied to the reset drain, the intervening semiconductor region provides a potential barrier that prevents charge flow between the floating diffusion and the reset drain, and (ii) when a second voltage is applied to the reset drain, the potential barrier between the floating diffusion region and the reset drain is lowered such that charge stored in the floating diffusion is transferred to the reset drain.

6. The image sensor according to claim 1, wherein the floating diffusion is shared between a plurality of pixels such that respective photocharge stored in the respective plurality of pixels that share the floating diffusion can be selectively transferred to the floating diffusion.

7. The image sensor according to claim 1, wherein respective pluralities of the pixels are configured to share respective floating diffusions, such that each floating diffusion is shared between two or more adjacent pixels.

8. The image sensor according to claim 1, wherein the pixel is configured such that the electrostatic potential of the floating diffusion changes by less than 500 mV upon being reset from a state corresponding to the full-well-capacity of the pixel having been transferred to the floating diffusion.

9. The image sensor according to claim 1, wherein the pixel is configured such that after the floating diffusion potential is reset by the reset drain and the floating diffusion is floating, the intervening semiconductor region includes a fully depleted portion that extends continuously between the floating diffusion and the reset drain.

10. The image sensor according to claim 1, wherein the reset gate overlap capacitance is zero.

11. The image sensor according to claim 1, wherein the sensor is a single-bit or a multi-bit Quanta Image Sensor.

12. The image sensor according to claim 1, wherein the sensor is a CMOS active pixel image sensor.

13. The image sensor according to claim 1, wherein the sensor is a photon-counting image sensor.

14. The image sensor according to claim 1, wherein the sensor is a pump-gate-type photodetector-device-based image sensor.

15. The image sensor according to claim 1, wherein the floating diffusion acts as, or is connected to, the gate of a junction field effect transistor.

16. The image sensor according to claim 1, wherein the floating diffusion is connected to the gate of a MOS field effect transistor.

17. The image sensor according to claim 1, wherein the pixel comprises a pinned photodiode configured to generate and accumulate the photocharge.

18. A method for providing an image sensor comprising a plurality of pixels, the method comprising:
    forming a floating diffusion in a semiconductor substrate; and
    forming a reset drain in the semiconductor substrate, wherein the reset drain is spaced away from the floating diffusion by an intervening semiconductor region having a dopant type opposite to the dopant type of the reset drain and the floating diffusion, and the reset drain and the intervening semiconductor region are configured such that the floating diffusion is selectively reset to an electrostatic potential, and an electrostatic potential barrier between the floating diffusion and the reset drain is selectively set, in response to a voltage pulse selectively applied to the reset drain.

19. The method according to claim 18, wherein the electrostatic potential of the floating diffusion is reset, and the electrostatic potential barrier between the floating diffusion and the reset drain is set, independent of operation of a reset transistor gate.

20. The method according to claim 18, wherein a gate electrode stack is not formed above the intervening semiconductor region between the floating diffusion and the reset gate.

* * * * *